United States Patent [19]
Haragashira

[11] Patent Number: 4,691,164
[45] Date of Patent: Sep. 1, 1987

[54] NUCLEAR MAGNETIC RESONANCE TRANSMITTER AND RECEIVER SYSTEM

[75] Inventor: Motoji Haragashira, Otawara, Japan

[73] Assignee: Kabushiki Kaisha Toshiba, Kawasaki, Japan

[21] Appl. No.: 901,737

[22] Filed: Aug. 29, 1986

[30] Foreign Application Priority Data

Aug. 30, 1985 [JP] Japan .............................. 60-191779

[51] Int. Cl.[4] ............................................. G01R 33/20
[52] U.S. Cl. ...................................... 324/322; 324/318
[58] Field of Search ............... 324/300, 318, 322, 307; 333/24 C, 25, 223

[56] References Cited

U.S. PATENT DOCUMENTS 4,602,213 7/1986 Sugiura .............................. 324/307
4,633,181 12/1986 Murphy-Boesch et al. ......... 324/322

OTHER PUBLICATIONS

Kan, S., et al., "A Single-Coil Triple Resonance Probe for NMR Experiments, Review of Scientific Instruments, vol. 51, No. 7, Jul. 1980.

*Primary Examiner*—Stewart J. Levy
*Assistant Examiner*—Kevin D. O'Shea
*Attorney, Agent, or Firm*—Schwartz, Jeffery, Schwaab, Mack, Blumenthal & Evans

[57] ABSTRACT

A tuning circuit for an NMR transmitter and receiver system includes a variable and fixed capacitor connected to a pick-up coil. Matching of the pick-up coil to a preamplifier is associated with matching to available cable impedance. As a consequence of the impedance matching, the resonance tuning is carried out by adjustment of the variable capacitor. In utilizing the tuning circuit, a high Q of pick-up coil is obtained and the detected NMR signal is optimally transferred to the preamplifier while the length of the cable connecting the coil with the preamplifier is not limited.

8 Claims, 5 Drawing Figures

4,691,164

NUCLEAR MAGNETIC RESONANCE TRANSMITTER AND RECEIVER SYSTEM

FIELD OF THE INVENTION

This invention relates to a nuclear magnetic resonance (NMR) system and more particularly to an improved nuclear magnetic resonance transmitter and receiver system connected to an NMR signal pick up probe.

BACKGROUND OF THE INVENTION

All magnetic resonance imaging methods require the following essential elements:
 (1) a uniform magnetic field,
 (2) controllable magnetic field gradients,
 (3) a transmitter/receiver coil system,
 (4) an NMR spectrometer,
 (5) a data store and processor,
 (6) an image display system, and
 (7) a central controller.

The transmitter/receiver coil system, often called the "probe", provides the means by which rf energy is transmitted to the spin system and through which the rf response to the spin system is detected. In many applications, a single coil with appropriate coupling can perform both functions. Tuning of the coil is required for both transmitting and receiving functions. Such tuned coil systems may be characterized by their geometry, a quality factor Q, impedance, and size.

It is desirable to maximize the signal-to-noise (S/N) ratio of the NMR signal in every possible way. The S/N ratio attainable with a tuned coil varies as $Q^{\frac{1}{2}}$. If these were the only considerations, Q should be made as large as possible. For a receiver coil the other dominant consideration is impedance matching to the receiver. The matching of the receiver coil to the preamplifier in the receiver depends upon the optimal noise impedance of the preamplifier, which should be designed to match available cable impedance. In practice, the length of cable is expected to be as long as possible in NMR system so as to facilitate the arrangement of the transmitter/receiver coil system with respect to the othe system elements. However, the length of the cable is limited by the requirement of matching its impedance to the receiver coil.

The tuning circuit used for the transmitter/receiver coil system shown in FIG. 1 consists of an inductor or coil 2 and resistance 4 which are, respectively, the inherent inductance and resistance of the probe 3. The effect of the matching capacitors 6 and 8 is to modify the signal and noise voltages as they appear at the output terminals of the probe 3.

A first lead of the coil 2 passes through shielding 10 and connects to the non-inverting input of preamplifier 12. The second lead of the coil 2 having capacitor 6 connected thereto, is connected to shielding 10 which is connected to the inverting input of preamplifier 12. A source of positive potential for controlling bias against the variable capacitor 8 is connected through a resistor 14 in parallel to the non-inverting input of the preamplifier 12. The output of the receiver portion including the preamplifier 12, the probe 3, and the tuning circuit 16, provides an analog of the composite NMR signal which is converted to digital form and fed to a computer (not shown) for performing reconstruction NMR imaging of the subject using a Fourier transform. Such NMR imaging techniques are well known and exemplified by U.S. Pat. No. 4,254,778; No. 4,070,611; No. 4,297,637; No. 4,509,011 and No. 4,471,306 incorporated herein by reference.

The function of circuit 16 is to match the impedance of pick-up coil 2 to the high input preamplifier impedance Z(amp), and for the effective transfer of the signal from the pick-up coil 2 to the preamplifier 12, it is necessary to match the input impedance of the coil 2 to the characteristic impedance Zc of the coaxial cable 10. Impedance matching ensures maximum transfer of the NMR signal from pick-up coil 2 to the preamplifier 12. Capacitor 6 is used for impedance matching, and capacitor 8 is used to tune the circuit to the resonant frequency to sweep across the frequency band of interest but has little effect on the input impedance. In order for the combination of capacitors 6 and 8 to have a very high quality factor (Q), the capacitors 6 and 8 are adjusted to make their capacitances approximately equal to facilitate tuning.

However, tuning is nevertheless difficult because of stray capacitance effects of the cable 10, and to facilitate tuning in consideration with the stray capacitance, the length of cable 10 must be limited despite competing practical requirements for a long cable length.

The approach of keeping Q high by adjusting the capacitors 6 and 8 in the previously mentioned manner is unsatisfactory because an electrical coupling exists between the pick-up coil 2 and the patient, which causes Q to be lowered, and this results in a competing consideration on the input impedance of preamplifier 12 and the electrical coupling.

The present invention provides an improved tuning circuit for an NMR transmitter and receiver system without loss of Q and without causing a strict limitation of the cable length. The invention also provides the added benefit of matching the effective pick-up coil impedance to the receiver preamplifier input impedance in an optimum manner. In this fashion, a longer cable is allowed to be used for connection between the pick-up probe and the receiver preamplifier despite its high stray capacitance while providing a high Q for the receiver system consisting of the combination of the pick-up coil, the tuning circuit, the shielding cable, and the receiver preamplifier, and desirably maximizing the signal-to-noise ratio of the NMR signal.

SUMMARY OF THE INVENTION

The invention tuning circuit with low loss, long signal paths for detecting and coupling NMR signal energy to a preamplifier of an NMR imaging receiver is made up of a coil and capacitors. Tuning of the signal to the proper detection frequency is accomplished by adjustment of the value of a capacitor connected at one end through a resistor to the coil and at its other end to a shielding cable. The value of the capacitor corresponds to the value of another capacitor which is associated with stray capacitance of the cable connecting the pick-up coil to the receiver preamplifier.

It is an object of this invention to provide a tuning circuit with low loss and longer signal paths for an NMR receiver system.

It is another object of the invention to provide a tuning circuit which allows a long signal cable to be used therein.

It is still another object of the invention to provide an improved tuning circuit consisting of a pair of capacitors effectively acting to keep the Q factor of the pick-up coil high affecting the stray capacitance of the cable while still maintain resonance.

BRIEF DESCRIPTION OF THE DRAWINGS

The features of the invention are set forth with particularity in the appended claims. The invention, both as to its organization and method of operation, together with further objects and advantages thereof, may best be understood by reference to the following description taken in conjunction with the accompanying drawings wherein:

DETAILED DESCRIPTION OF THE PREFERRED EMBODIMENTS

Figure 1:
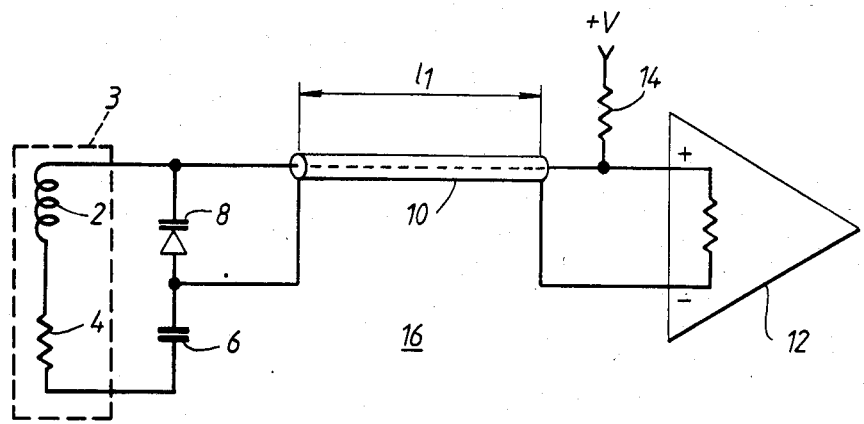
FIG. 1 is a schematic diagram illustrating a conventional tuning circuit for an NMR transmitter and receiver system.
Figure 2:
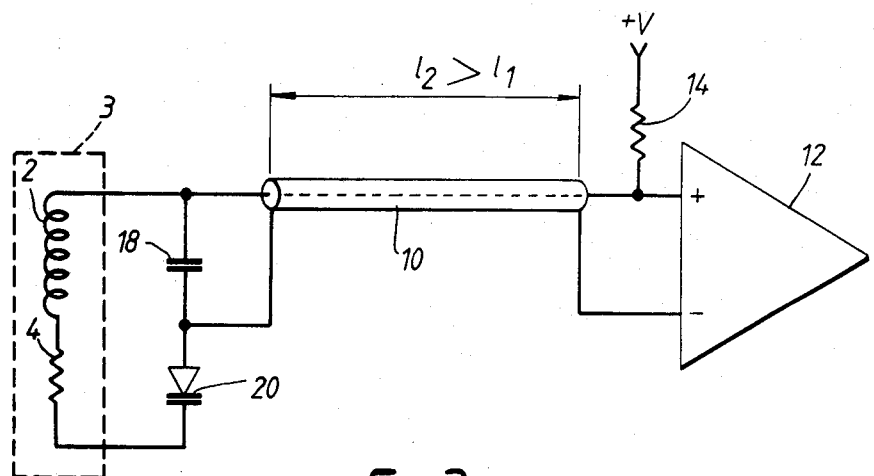
FIG. 2. is a schematic diagram of the electronic circuitry of a receiver system according to the present invention.

Referring now to FIG. 2 of the drawings, there is shown a block diagram of the electronic circuitry of a receiver system showing the major system components and their interrelation. FIG. 2 is similar to FIG. 1 showing a schematic diagram of the conventional tuning circuit, previously discussed, with the notable exception that in FIG. 2, a fixed capacitor 18 and a variable capacitor 20 are connected to coil 2 in series and in a reverse manner from that shown in FIG. 1. The remaining elements are designated by the same numerical references as in FIG. 1. In the circuit configuration shown in FIG. 2, one end of a coil 2 is connected to fixed capacitor 18, and at its other end, the coil 2 is connected through a total resistor 4, representing the ohmic resistance of coil 2 and the resistance associated with the patient, to a variable capacitor 20 having a variable capacitance C1. The junction between the fixed capacitor 18 and variable capacitor 20 is connected to shielding 10 and coupled to the inverting input of preamplifier 12. The other end of coil 2 is connected to a signal wire which passes through shielding 10 and connects to the non-inverting input of the preamplifier 12. A source of voltage coupled via fixed resistor 14 is fed to capacitor 18 via the signal path from the pick-up coil 2 to the non-inverting input of preamplifier and is operable to adjust a bias applied to the fixed capacitor 18. The receiver system including the preamplifier 12, filters and demodulator (not shown) is connected via an analog-to-digital converter to a computer (not shown) which carries out discrete Fourier transforms on the digitized output of the preamplifier 12 to make phase corrections, and to generate NMR images.

A uniform and predictable total capacitance Ct represents the combined capacitance of the fixed capacitor 18 and stray capacitance of the cable 10. This capacitance is ascertained beforehand to achieve the best possible matching and the best possible tuning when the operating (resonance) frequency has been selected by adjustment of the variable capacitor 20.

The equivalent circuits of FIGS. 3 and 4 will aid in following the principle and performance of the tuning circuit as described hereinafter.

Figure 3:
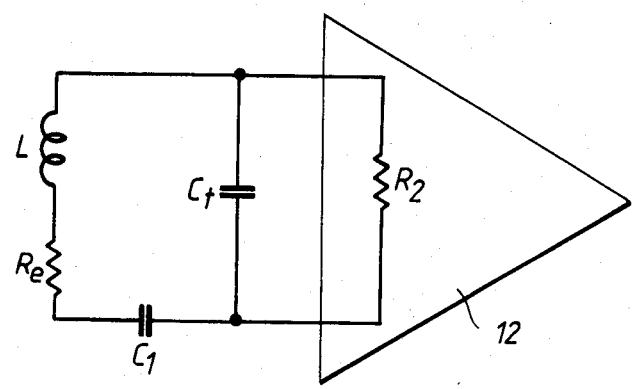
FIG. 3. is a diagram showing the equivalent circuit of a tuning circuit employed in the system of the present invention useful in interpreting the principle of the present invention.

In FIG. 3, the inductance L of the coil 2 depends on the number of turns and the coil diameter. The effective resistance Re arises from three sources: the intrinsic skin effect resistance of the coil 2, leakage through the non-ideal dielectrics of the tuning capacitors 18 and 20, and the resistance corresponding to the losses associated with eddy currents induced in the patient (not shown). C1 is the capacitance of the variable capacitor 20, and R2 is the resistance from the input impedance Z in the preamplifier which is resistive at the operating frequency.

When R2 is assumed to be infinite, the Q of a coil may be generally defined as $$Q = 1/wR1(1/C1 + 1/Ct) \quad (1)$$

where w is the resonance frequency.

At a resonant condition, the following relation holds.

$$1/C1 + 1/Ct = \text{constant} \quad (2)$$

Figure 4:
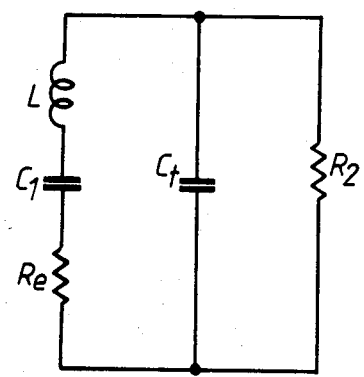
FIGS. 4 and 5 are representations of the equivalent circuits considering the resonant frequency components.
Figure 5:
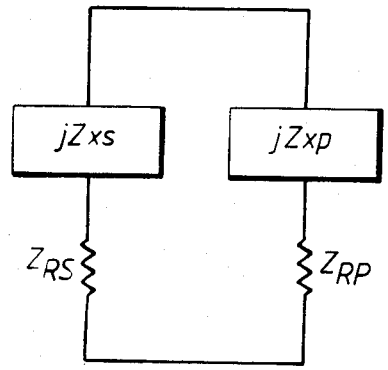

Referring to FIGS. 4 and 5 L, C1, and Re now behave as a series resistance $Z_{RS}$ illustrated in FIG. 5, and the resistance $Z_{RS}$ and reactance $Z_{XS}$ of the pick-up coil 2 with capacitor C1 are respectively, $$Z_{RS} = Re \quad (3)$$

$$Z_{XS} = wL - 1/wC1$$

Similarly in the parallel circuit constituted by the predictable total capacitor Ct connected in parallel with the resister R2 of the preamplifier 12, the parallel resistance $Z_{RP}$ and parallel reactance $Z_{XP}$ are, $$\left. \begin{array}{l} Z_{RP} = R2/(1 + w^2 Ct^2 R2^2) \\ Z_{XP} = -R2^2 wCt/(1 + w^2 Ct^2 R2^2) \end{array} \right\} \quad (4)$$

On the other hand, if the resistance R2 is finite, the Q factor Q′ of pick-up coil 2 is given by, $$Q' = 1/wCc(Z_{RS} + Z_{RP}) \quad (5)$$

$$= \cfrac{1}{w\left(Re + \cfrac{R2}{1 + w^2 Ct R2^2}\right)\left(\cfrac{C1(1 + w^2 Ct^2 R2^2)}{1 + w^2(C1 + Ct)Ct R2^2}\right)}$$

where $LCcw^2 = 1$, and $1/Cc = 1/C1 + 1/Ct$.

The expression for the Q factor of coil 2, Q′, in Eq. (5) is rewritten, $$Q' = \cfrac{1}{w\left(Re + \cfrac{R2}{w^2 Ct^2 R2^2}\right)\left(\cfrac{w^2 C1 Ct^2 R2^2}{w^2(C1 + Ct)Ct R2^2}\right)} \quad (6)$$

where $1 << w^2 Ct R2^2$.

Since the inductance L is constant, and by definition $1/Cc = 1/C1 + 1/Ct$, Q′ may be made large by the following three alternative approaches:

(a) by reducing the value of the resistor Re,
(b) by having the higher value of the preamplifier input impedance, in other words by making the value of resistor R2 large, and (c) by increasing the total capacitance Ct associated with the stray capacitance of the coaxial cable 10.

Both approaches (a) and (b), however, are unsatisfactory for the purpose of moderating the limitation to the cable length connecting the probe with the receiver preamplifier without interfering with impedance matching and resonance tuning.

In approach (a), there is a limitation in reducing the resistance Re because of the extreme effect of the resistance corresponding to the losses associated with eddy currents induced in the patient as distinguished from those induced in the coil.

With respect to approach (b), it is difficult to adjust R2 since the value of the input impedance of the preamplifier is determined in accordance with the circuit configuration constituting of appropriate component and/or element, and is inherent for the particular circuit design.

In accordance with the present invention, which arranges the combination of the variable capacitor and fixed capacitor as illustrated in FIG. 2, the high Q factor of coil 2 is obtained by increasing the value of capacitance Ct under the condition that the value of capacitance C1 meets the requirement;

$$1/C1 + 1/Ct = \text{CONST.}$$

This technique corresponds to the third approach mentioned above.

In the tuning circuit in which this technique is implemented, it is possible to change the value of the total capacitance Ct while extending the length of the coaxial cable because the fixed capacitor 18 is arbitrarily assigned its value so as to match the characteristic impedance of the coaxial cable to the input impedance of the preamplifier. Due to the impedance matching of the loading the circuit with a suitable value of capacitance the obtained high Q of coil 2 provides a favorable ratio of output to input energy which improves the effective signal-to-noise ratio of the NMR signal.

The resonant condition varies in response to the changes in the length of cable 10, and the desirable resonant condition is obtained by adjustment of the capacitance of the variable capacitor 20.

Note that the level of the detected NMR signal energy at pick-up-coil 2 is transferred to the preamplifier 12 divided according to the ratio of (C1/(C1+Ct)), and the level transferred to the preamplifier 12 is affected by the value of the capacitance Ct. If the capacitance is too large, the input level to the preamplifier 12 becomes low, however, this problem is solved by employing the design of a preamplifier with a low noise figure.

As an example illustrating the selection of values of capacitors 18 and 20 one may first select the desired length of cable.

After the length of the cable 10 is fixed, for example 2-3 meters which is enough to facilitate mounting and circuiting of the probe to a gantry, the value of the fixed capacitor 18 is selected for impedance matching so a to make the level of inherent noise in the observed NMR signal larger than the noise level of the preamplifier in the receiver in consideration of the stray capacitance of the cable. Practically, the longer the cable, the smaller the value selected for the fixed capacitor 18. The selection of the cable length and capacitor 18 thus determines C1.

On the other hand, the value of the variable capacitor 20 is determined in response to the resonant frequency, and in practice, as the result of such adjustment, the value of capacitor 18 is nearly equal to that of capacitor 20.

The resonant condition in the circuitry shown in FIG. 2 is defined as follows:

$$LC_c w^2 = 1$$

where $1/Cc = 1/C1 + 1/Ct$ and w is the resonant frequency.

Under this condition, if w changes, Cc must also change in correspondence to the change of w. Therefore, $(1/C1 + 1/Ct)$ has a constant value depending upon the resonant frequency.

Once the value of Cc is determined, and the cable length and value C1 selected as indicated above, the adjustment of the variable capacitor 20 is performed provided that the requisite length of cable is kept as initially selected.

While certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A tuning circuit for a nuclear magnetic resonance transmitter and receiver system for sensing and coupling an NMR signal to a preamplifier comprising:
    a pick-up coil,
    a first capacitive element (18) connected in parallel with said pick-up coil, the capacitance of which is associated with a shielded connection means for transferring the NMR signal detected at said pick-up coil to said preamplifier, and
    a second capacitive element (20) connected to said coil for forming a resonant circuit in combination with said pick-up coil,
    wherein the respective values of said capacitive elements are such that the following condition applies $1/C1 + 1/Ct = \text{constant}$ where Ct is the total capacitance of the first capacitive element and the stray capacitance of the connection means and C1 is the capacitance of said second capacitive element.

2. The tuning circuit of claim 1, wherein said first capacitive element is a fixed capacitor, and second capacitive element is a variable capacitor.

3. The tuning circuit of claim 2, wherein said fixed and variable capacitors are connected together in series and the junction between said fixed and variable capacitors is connected to shielding of said connection means and to a non-inverting input of said preamplifier.

4. The tuning circuit of claim 3, wherein said fixed capacitor is connected in parallel with said pick-up coil and with said connection means, and operates to match the input impedance of said coil to the impedance of said connection means.

5. The tuning circuit of claim 4, including means for applying a bias voltage to said fixed capacitor.

6. A tuning circuit for sensing and coupling an NMR signal to a preamplifier comprising:
    (a) a pick-up coil,
    (b) a first capacitive element having a first side thereof connected to one end of said pick-up coil and to a central signal wire of a coaxial cable,
    (c) a second side of said first capacitive element connected to a shielded conductor of said coaxial cable, (d) a second capacitive element having a first side thereof electrically connected to said second side of said first capacitive element,
(e) a second side of said second capacitive element electrically connected to the other end of said pick-up coil, and
(f) said first and second capacitive elements selected such that:

$$1/C1 + 1/Ct = \text{constant}$$

$$LCcw^2 = 1$$

where $$Cc = 1/C1 + 1/Ct$$

L = the inductance of said pick-up coil,
w = the resonant frequency of the tuning circuit,
Ct = the combined capacitance of said first capacitive element and the stray capacitance of said cable.

7. The tuning circuit as recited in claim 6, wherein said first capacitive element is a fixed capacitor, and second capacitive element is a variable capacitor.

8. The tuning circuit as recited in claim 7, including means for applying a bias voltage to said fixed capacitor.

* * * * *